(12) United States Patent
Linnen et al.

(10) Patent No.: US 11,908,529 B2
(45) Date of Patent: Feb. 20, 2024

(54) DATA STORAGE DEVICE HAVING OVER-VOLTAGE DETECTION AND PROTECTION

(71) Applicant: Western Digital Technologies, Inc., San Jose, CA (US)

(72) Inventors: Daniel J. Linnen, Naperville, IL (US); Kirubakaran Periyannan, Santa Clara, CA (US); Khanfer A. Kukkady, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 165 days.

(21) Appl. No.: 17/579,246

(22) Filed: Jan. 19, 2022

(65) Prior Publication Data

US 2023/0230641 A1    Jul. 20, 2023

(51) Int. Cl.
*G11C 7/00* (2006.01)
*G11C 16/30* (2006.01)
*H02H 3/087* (2006.01)
*H02H 3/20* (2006.01)

(52) U.S. Cl.
CPC ............ *G11C 16/30* (2013.01); *H02H 3/087* (2013.01); *H02H 3/202* (2013.01)

(58) Field of Classification Search
CPC ....... G11C 5/147; G11C 5/14; G11C 11/4074; G11C 16/30; G11C 5/143

USPC ......................................................... 365/226
See application file for complete search history.

(56) References Cited

U.S. PATENT DOCUMENTS

| | | | |
|---|---|---|---|
| 7,557,725 B2* | 7/2009 | Shahidzadeh | G06F 11/3037 340/657 |
| 2011/0025281 A1* | 2/2011 | Cross | H02M 3/156 323/282 |
| 2019/0280464 A1* | 9/2019 | Tang | F02P 11/00 |

\* cited by examiner

*Primary Examiner* — Son T Dinh
(74) *Attorney, Agent, or Firm* — Michael Best & Friedrich LLP

(57) ABSTRACT

A data storage device includes a power supply circuit configured to supply power to the data storage device. The power supply circuit includes a voltage clamp configured to operate in a conduction state in response to an over-voltage condition of the power supply circuit. The power supply circuit also includes a fuse in series with the voltage clamp. The fuse is configured to open in response to a current flow through the fuse and the voltage clamp exceeding a threshold value. The power supply circuit also includes a switching device that is configured to latch in a forward conduction mode in response to the voltage clamp operating in the conduction state. The switching device couples power from a positive voltage bus to the voltage clamp when the switching device is in the forward conduction mode.

20 Claims, 7 Drawing Sheets

DATA STORAGE DEVICE HAVING OVER-VOLTAGE DETECTION AND PROTECTION

FIELD

This application relates generally to data storage devices, and more particularly, to data storage devices having over-voltage detection and protection.

BACKGROUND

Data storage devices, such as solid-state drives ("SSD"), may experience failures from various events, such as excess current. As described in more detail herein, many data storage devices have a protective device, such as a fuse, which protects many of the electronic components within the data storage device from over-current conditions. When a failed data storage device is analyzed during repair and/or for quality purposes, there is limited information as to what may have caused the protection device (e.g., fuse) to operate (e.g., remove power from the components on the load side of the protection device.) For example, while a blown fuse may indicate that there was an overcurrent condition that occurred, it is unknown what the underlying cause was.

SUMMARY

Over-voltage events within data storage devices may generally result in an over-current protection device (e.g., fuse) blowing to protect the various components within the data storage device, such as the non-volatile memory. While the components are protected, little information is available with respect to the event that caused the fuse to open. The concepts described herein provide both visual and electronic indications that an over-voltage event has occurred. This provides additional information related to over-voltage faults experienced by the data storage device to system designers, data storage device manufacturers, etc. For example, where multiple over-voltage events are detected in a server or other large-scale system, system engineers may be able to quickly pinpoint the problem within a power supply of the system to prevent further failures.

One embodiment of the disclosure describes a power supply circuit configured to supply power to the data storage device. The power supply circuit includes a voltage clamp configured to operate in a conduction state in response to an over-voltage condition of the power supply circuit, and a fuse in series with the voltage clamp and the positive voltage bus. The fuse is configured to open in response to a current flowing through the fuse and the voltage clamp exceeding a threshold value. The power supply circuit further includes a switching device configured to latch in a forward conduction mode in response to the voltage clamp operating in the conduction state. The switching device couples a positive voltage bus to the voltage clamp when operating in the forward conduction mode.

In other embodiments, a method is described and is performed by a data storage device having a controller coupled to a non-volatile memory device, according to some embodiments. The method includes detecting an occurrence of an over-voltage condition, wherein the over-voltage condition is detected by an over-voltage detection circuit. The method further includes receiving an indication of the detected occurrence of the over-voltage condition at the controller, storing the occurrence of the over-voltage condition in a memory, and transmitting the occurrence of the over-voltage condition to an external device.

In other embodiments, a data storage device includes a power supply circuit. The power supply circuit includes a voltage clamp configured to operate in a conduction state in response to an over-voltage condition of the power supply circuit, and a fuse in series with the voltage clamp and the positive voltage bus. The fuse is configured to open in response to a current flowing through the fuse and the voltage clamp exceeding a threshold value. The power supply circuit further includes a switching device configured to latch in a forward conduction mode in response to the voltage clamp operating in the conduction state. The switching device couples a positive voltage bus to the voltage clamp when operating in the forward conduction mode. The power supply circuit includes an over-voltage detection circuit configured to detect an occurrence of an over-voltage event.

Various aspects of the present disclosure provide for data storage devices with over-voltage protection and detection circuitry. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, DRAM, etc.

Figure 1:
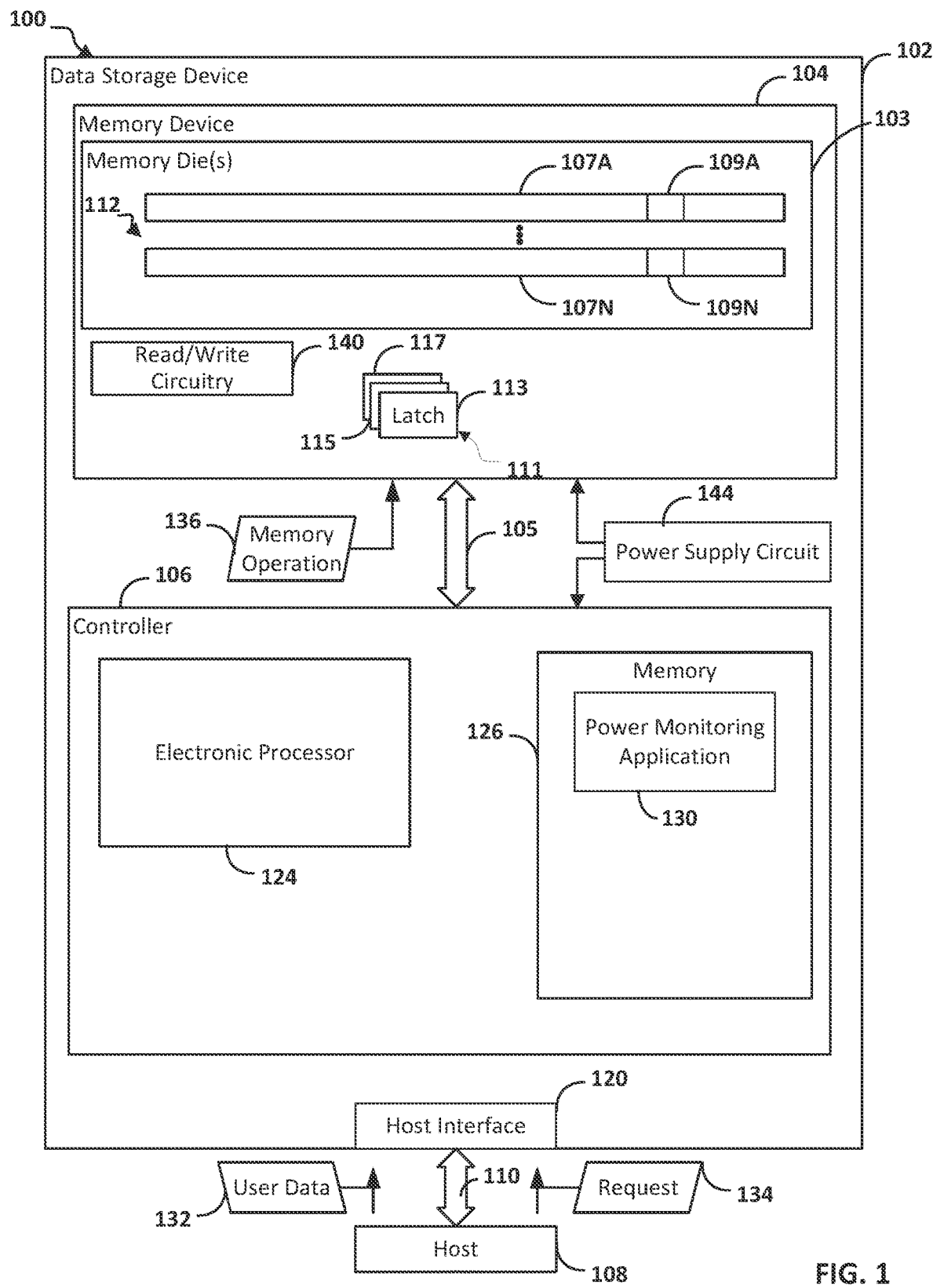
FIG. 1 is a block diagram illustrating one example of a system including a data storage device, according to some embodiments.

FIG. 1 is a block diagram of one example of a system 100 that includes various power supply protection and monitoring functionality. In the example of FIG. 1, the system 100 includes a data storage device 102 in communication with a host device 108. The data storage device 102 includes one or more memory devices 104 (e.g., non-volatile memory) that are coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled through a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid-state drive, which may be used as an embedded storage drive (e.g., a mobile embedded storage drive), an enterprise storage drive, a client storage device, a cloud storage drive, or other suitable storage drives.

The data storage device 102 may be configured to be coupled to the host device 108 using the communication path 110, such as a wired communication path and/or a wireless communication path. For example, the data storage device 102 may include an interface 120 (e.g., a host interface) that enables communication using the communication path 110 between the data storage device 102 and the host device 108, such as when the interface 120 is communicatively coupled to the host device 108. In some examples, the host device 108 may provide power to the data storage device 102. For example, the host device 108 may provide one or more regulated voltages to the data storage device 102, such as 12 VDC, 5 VDC, 3.3 VDC, or other regulated voltage.

The host device 108 may include a processor 124 and a memory 126. The memory 126 may be configured to store data and/or instructions that may be executable by the processor 124. The memory 126 may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data to be read from the memory device 104. The host device 108 may include a mobile smartphone, a music player, a video player, a gaming console, an electronic book reader, a personal digital assistant ("PDA"), a computer, such as a laptop computer or notebook computer, any combination thereof, or other suitable electronic device.

The host device 108 communicates using a memory interface that enables reading from the memory device 104 and writing to the memory device 104. In some examples, the host device 108 may operate in compliance with an industry specification, such as a Universal Flash Storage ("UFS") Host Controller Interface specification. In other examples, the host device 108 may operate in compliance with one or more other specifications, such as a Secure Digital ("SD") Host Controller specification or other suitable industry specification. The host device 108 may also communicate with the memory device 104 in accordance with any other suitable communication protocol.

The memory device 104 of the data storage device 102 may include a non-volatile memory (e.g., NAND, NOR BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. In some of the embodiments, individual memory dies 103 or groups of memory dies 103 may be referred to as arrays. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies 103 may include corresponding read/write circuitry 140 that is operable to read from and/or write to storage elements within the individual memory die, independent of any other read and/or write operations at any of the other memory dies. For example, the read/write circuitry 140 may be configured to perform various read/write operations such as initial writing to volatile memory, array commit functions, and other functions as required for a given application. The memory device 104 may further include one or more latches (e.g., a set of latches 111 including latches 113, 115, and 117).

The data storage device 102 may further include a power supply circuit 144. The power supply circuit 144 may be configured to provide power to one or more of the components of the data storage device 102, such as the memory devices 104 and/or the controller 106. In some embodiments, the power supply circuit 144 receives power from the host device 108, such as through the host interface 120, as described above. In other embodiments, the data storage device 102 may have one or more additional interfaces (not shown) for receiving one or more voltages. While the data storage device 102 is shown as having a single power supply circuit 144, more than one power supply circuit 144 may be within a data storage device, as required for a given application. For example, in some examples, the data storage device 102 may include a power supply circuit 144 for each operating voltage associated with or received by the data storage device 102, such as 12 VDC, 5 VDC, 3.3 VDC, or other operating voltage. The power supply circuit 144, and its various configurations will be described in more detail herein.

The controller 106 is coupled to the memory device 104 (e.g., the one or more memory dies 103) using a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 using the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data, as well as a size (e.g., 2k, 4k, etc.) of the data to be written.

The controller 106 is configured to send a read command to the memory device 104 to access data from a specified address of the memory device 104. The read command may specify the physical address of a region of the memory device 104 (e.g., a physical address of a word line of the memory device 104), as well as a size (e.g., 2k, 4k, etc.) of the data to be read. The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124. The memory 126 may include a power monitoring application 130 among other applications, programs, etc. The power monitoring application 130 may be configured to receive information related to the power supplied to the data storage device 102, such as from the power supply circuit 144. The power monitoring application 130 may store information related to detected power faults, and/or transmit detected power fault information (e.g., over-voltage) to one or more external devices, such as from the host interface 120. While shown as being stored in the memory 126, in some examples the power monitoring application 130 may be configured as a circuit within the memory device 104.

Figure 2:
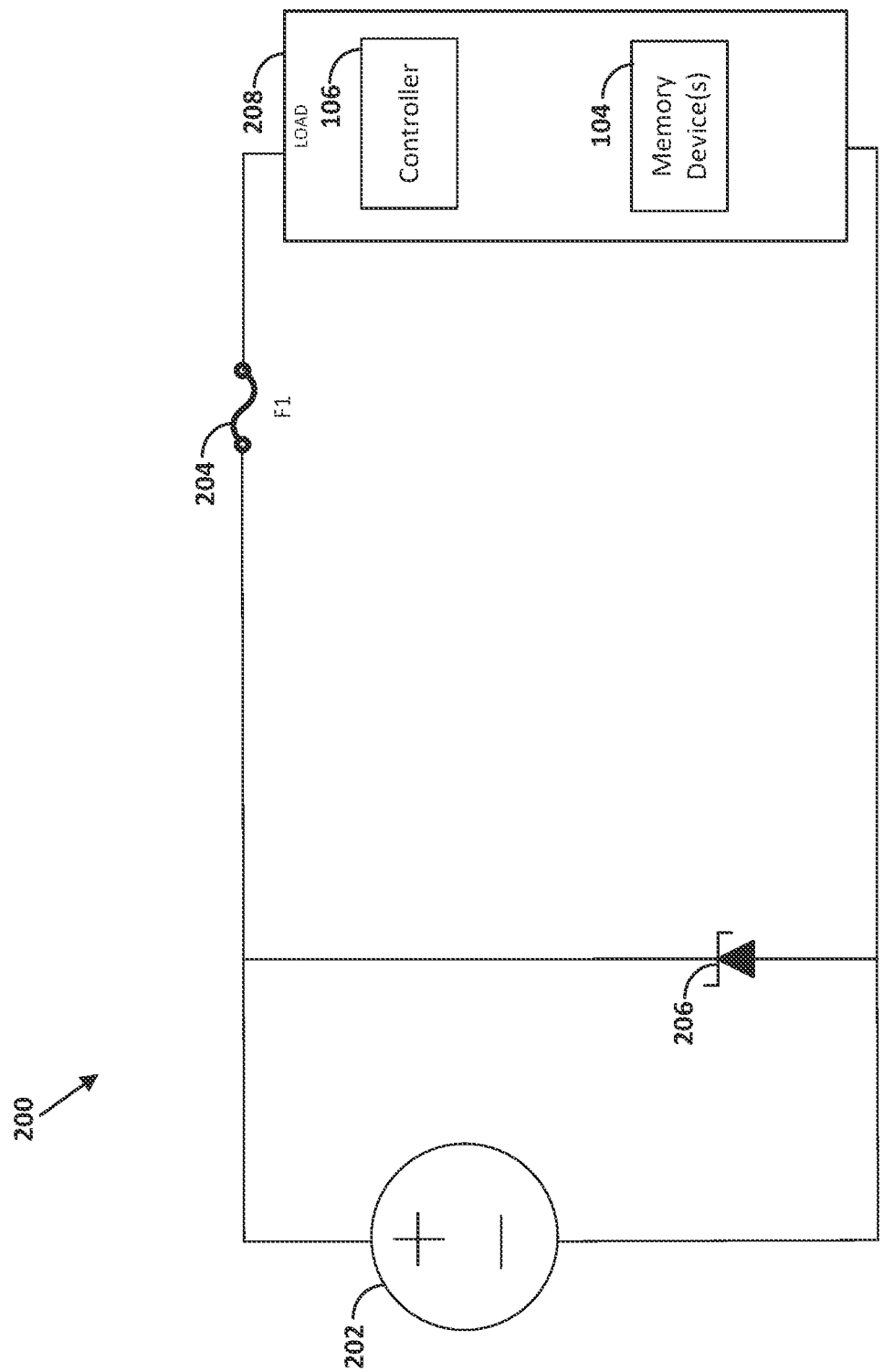
FIG. 2 is a block diagram illustrating a known power supply circuit for a data storage device, according to some embodiments.

Turning now to FIG. 2, a block diagram of a general power supply circuit 200, such as power supply circuit 144 of FIG. 1, for a data storage device, such as data storage device 102 of FIG. 1, is shown, according to some embodiments. The general power supply circuit 200 may receive power from a power source 202. The power source 202 may be an external power source provided from one or more connections to the data storage device 102. In other embodiments, the power source 202 may be provided from a power supply or regulator within the data storage device 102. For example, the power source 202 may be 12 VDC power source, a 5 VDC power source, a 3.3 VDC power source, or other DC power source as required for a given application. The general power supply circuit 200 includes a fuse 204 and may also include a voltage clamp/electrostatic discharge ("ESD") device 206. The general power supply circuit 200 is further configured to output power to a load 208. The load 208 may include one or more components of the data storage device 102, such as the memory devices 104 and/or the controller 106.

The ESD device 206 may be configured to create a low resistance path to a negative or common bus 210 from a positive bus 212 when the voltage on the positive bus 212 exceeds a threshold value. In some examples, the threshold values may be a percentage of the desired operating voltage. For example, the threshold value may be 120% of the nominal operating voltage provided by the power source 202. However, threshold values of more than 120% or less than 120% are also considered as appropriate for a given application. As shown in FIG. 2, the ESD device 206 may be a breakover semiconductor, such as a Zener diode. In other examples, the ESD device 206 may be an array of Zener diodes, one or more transient-voltage-suppression diodes ("TVS diode"), or other applicable circuitry.

The fuse 204 is configured to open when the current through the fuse 204 exceeds a threshold value. In some examples, the threshold value may be 2 amps. However, threshold values of more than 2 amps or less than 2 amps are also contemplated. In one example, the fuse 204 may be a quick blow fuse. However, other fuse types are also contemplated. Additionally, in some embodiments, over-current protection devices other than fuses may be used in lieu of the fuse 204, such as circuit breakers, thermistors, or other applicable circuitry.

As shown in FIG. 2, the general power supply circuit 200 is configured such that in the event of an over-current condition, the fuse 204 opens, thereby removing power from the load 208. While the ESD device 206 may prevent some over-voltage conditions from causing an over-current condition which results in the fuse 204 opening, sudden increases in voltages may still result in the fuse 204 opening due to increased current resulting from the over-voltage condition. Additionally, many power supply circuits 200 do not include the ESD device 206 and rely solely on the fuse 204 for protection. As the fuse 204 remains in an open condition after opening due to the mechanical operation of a fuse (e.g., melting link, physical separation of conductors, etc.), the data storage device 102 is no longer functional, as no power is provided to the various components, such as the controller 106 and the memory device 104 coupled to the power source 202. When an analysis of the data storage device 102 is performed by the manufacturer or other authorized repair entities, the only data available to the repair entity is that the fuse 204 opened. While this may have been caused by an over-voltage condition creating the current required to open the fuse 204, there is no mechanism in the general power supply circuit 200 to determine that an over-voltage condition had occurred. This may be a critical piece of data required to determine a root cause of the failure. For example, the power source 202 may be malfunctioning, thereby outputting voltages at too high of a level for the data storage device 102, either constantly or transiently (e.g., voltage spikes).

Figure 3:
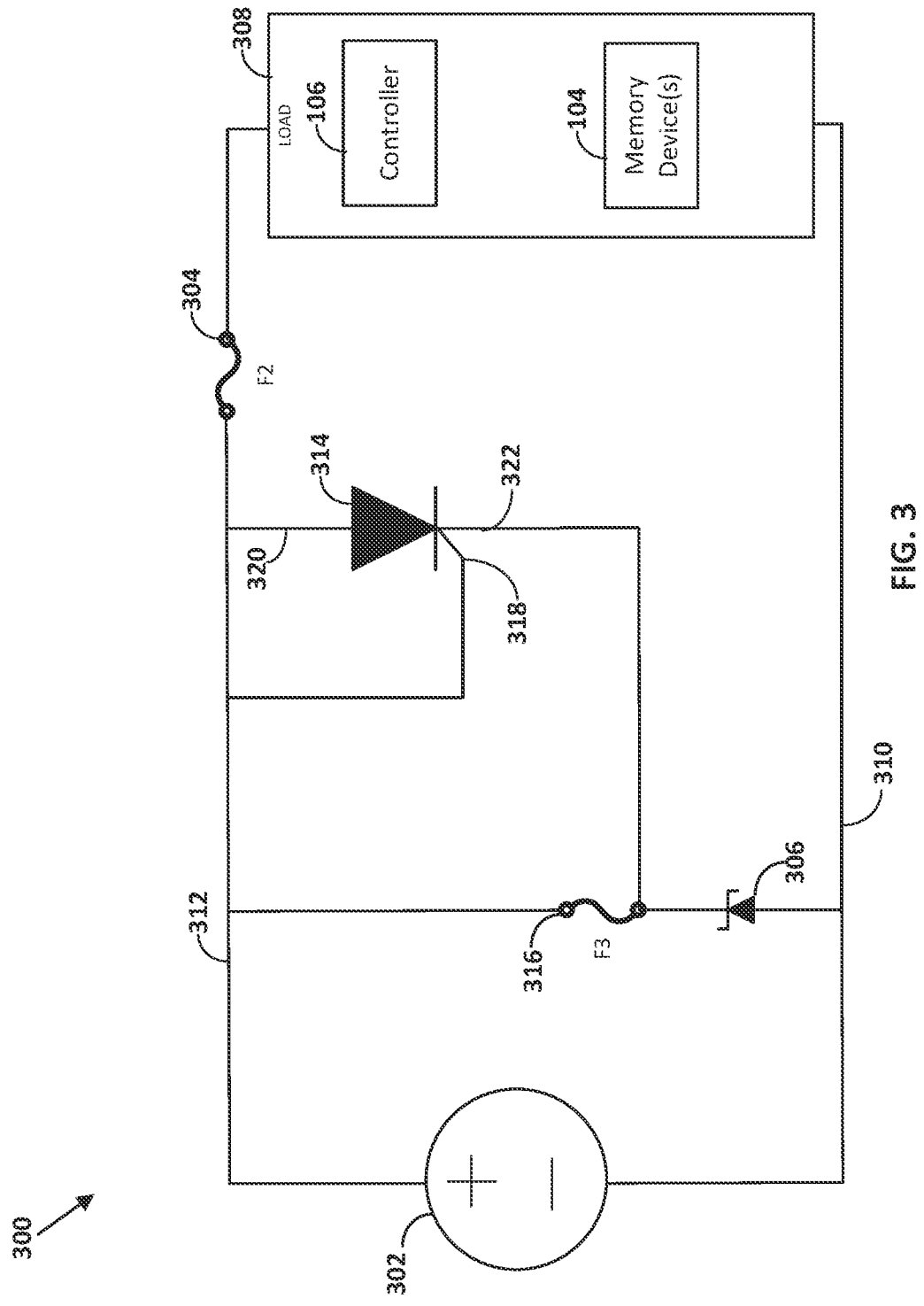
FIG. 3 is a block diagram illustrating a power supply circuit for a data storage device, according to some embodiments.

Turning now to FIG. 3, a power supply circuit 300 is shown which provides an indication that an over-voltage condition has occurred, according to some embodiments.

The power supply circuit 300 may be similar to power supply circuit 144 described above. As shown in FIG. 3, the power supply circuit 300 includes a power source 302, a load fuse 304, a voltage clamp/ESD device 306, and a load 308. Similar to the general power supply circuit 200, the power source 302 may be an external power source provided using one or more connections to the data storage device 102. In other embodiment, the power source 302 may be provided by a power supply or regulator within the data storage device 102. For example, the power source 302 may be 12 VDC power source, a 5 VDC power source, a 3.3 VDC power source, or other DC power source as required for a given application.

The voltage clamp/ESD device 306 is configured to create a low resistance path to a negative or common bus 310 from a positive bus 312 in response to the voltage on the positive bus exceeding a threshold value. In some examples, the threshold values may be a percentage of the desired operating voltage. For example, the threshold value may be 120% of the nominal operating voltage provided by the power source 302. However, threshold values of more than 120% or less than 120% are also considered as appropriate for a given application. As shown in FIG. 3, the voltage clamp/ESD device 306 may be a breakover semiconductor, such as a Zener diode. In other examples, the voltage clamp/ESD device 306 may be an array of Zener diodes, or other applicable circuitry.

Similar to the fuse 204 of FIG. 2, the load fuse 304 is configured to open when the current through the fuse 204 exceeds a threshold value. In some examples, the threshold value may be 2 amps. However, threshold values of more than 2 amps or less than 2 amps are also contemplated. In one example, the fuse 304 may be a quick blow fuse. However, other fuse types are also contemplated. Additionally, in some embodiments, over-current protection devices other than fuses may be used in lieu of the load fuse 304, such as circuit breakers.

The power supply circuit 300 further includes a switching device, shown as a thyristor 314, and an over-voltage fuse 316. While the switching device is shown and described as a thyristor 314, it is contemplated that other switching device types, such as metal oxide semiconductors ("MOSFET"), insulated gate bipolar transistors ("IGBT"), and/or other switching devices may be used as appropriate for a given application. A gate 318 of the thyristor 314 is connected to the positive bus 312 along with the anode 320 of the thyristor 314. A cathode 322 of the thyristor 314 is coupled to the cathode of the voltage clamp/ESD device 306. The over-voltage fuse 316 is configured to open when a current flows through the over-voltage fuse 316 that exceeds a predetermined threshold. The predetermined threshold may be a lower value than the predetermined threshold of the load fuse 304. For example, the predetermined threshold may be 2A. However, values of more than 2A and less than 2A are also contemplated as required for a given application. In one embodiment, the over-voltage fuse 316 is sized such that any current flow through the voltage clamp/ESD device 306 during a breakover condition is sufficient to operate the over-voltage fuse 316. In some examples, the over-voltage fuse 316 may be a quick blow fuse. As the over-voltage fuse 316 is positioned between the positive bus 312 and the voltage clamp/ESD device 306, current only flows through the over-voltage fuse 316 when the voltage on the positive bus 312 is sufficiently high to cause the voltage clamp/ESD device 306 to start conducting, causing current to flow from the positive bus 312 to the common bus 310 through the voltage clamp/ESD device 306, and therefore the over-voltage fuse 316.

Further, when the voltage clamp/ESD device 306 begins conducting, current also flows through the gate 318 of the thyristor 314 and through the cathode 322 of the thyristor 314. This current flow latches the thyristor 314 in a forward conduction mode, such that current flows from the positive bus 312 through the thyristor 314. This allows for the voltage clamp/ESD device 306 to continue to breakover (e.g., provide over-voltage protection) in the case of an over-voltage condition, as the voltage of the positive bus 312 is provided to the voltage clamp/ESD device 306 through the thyristor 314 when the thyristor 314 is latched in the forward conduction mode.

Figure 4:
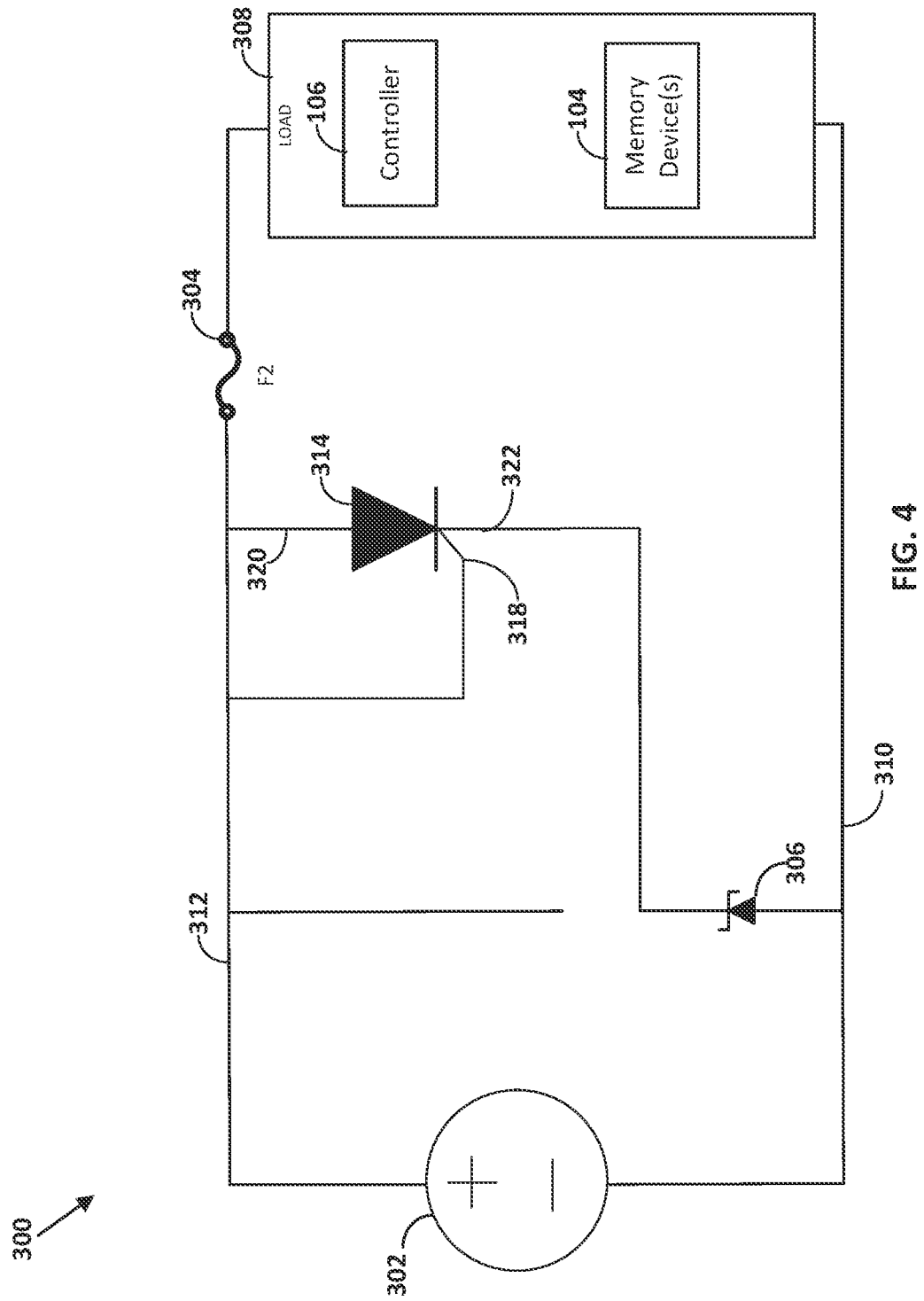
FIG. 4 is a block diagram illustrating the state of the power supply circuit of FIG. 3 after an over-voltage event occurrence, according to some embodiments.

Turning now to FIG. 4, the power supply circuit 300 of FIG. 3 is shown where the over-voltage fuse 316 has opened, such as due to an over-voltage condition, as described above. The blown over-voltage fuse 316 provides a visual indication that an over-voltage condition has occurred. Thus, even where the load fuse 304 also opens, causing power to be removed to the load 308, during repair or failure analysis, it can be easily determined that an over-voltage condition has occurred based on the operational status (e.g., open or not opened) over-voltage fuse 316.

Figure 5:
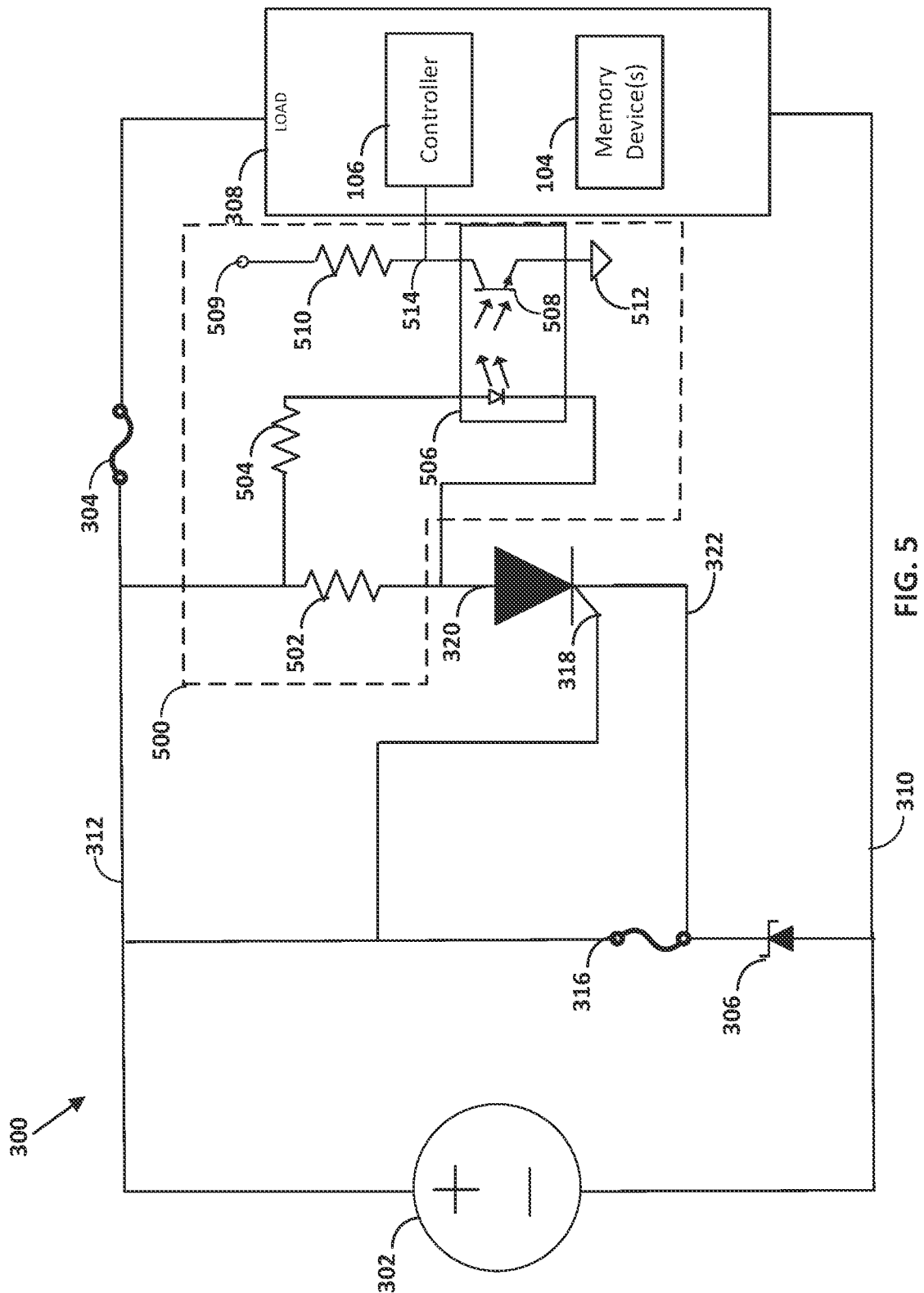
FIG. 5 is a block diagram of the power supply circuit of FIG. 3 having a current-based over-voltage detection circuit, according to some embodiments.

Turning now to FIG. 5, the power supply circuit 300 of FIG. 3 is shown and further includes a current-based over-voltage detection circuit 500. A first resistor 502 is positioned between the anode 320 of the thyristor 314 and the positive bus 312. After an over-voltage condition occurs causing the over-voltage fuse 316 to open, the thyristor 314 latches into the forward conduction mode, as described above. A current will then flow from the positive bus 312 through the thyristor 314 and therefore the first resistor 502. A second resistor 504 is also coupled to the positive bus 312 and is in series with an optocoupler 506 input. The second resistor 504 and the optocoupler 506 are in parallel with the first resistor 502, such that a current flow through the thyristor 314 results in a current flow through an input of the optocoupler 506 due to the voltage differential across the first resistor 502.

The current flow through the input of the optocoupler 506 causes the output of the optocoupler 506 to turn on a switch 508 at the optocoupler 506 output. When the switch 508 is turned on, a current path from a logic high voltage source 509 through a pull up resistor 510 and to a common potential terminal 512 is created. The current through the pull-up resistor 510 causes a voltage of the logic high voltage source 509 to be substantially dropped across the pull-up resistor 510, resulting in a logic low level (e.g., less than 1V) at connection point 514. The connection point 514 may be coupled to an input of the controller 106. When the voltage at the connection point 514 transitions to a logic low, the controller 106 may interpret the change in logic level as indicating that an over-voltage condition has occurred. In one example, the logic high voltage source 509 is 3.3 VDC. However, voltages of more than 3.3 VDC or less than 3.3 VDC are also contemplated as required for a given application. Additionally, while FIG. 5 shows a pull-up arrangement being used on the output of the optocoupler 506, it is contemplated that other arrangements, such a pull-down arrangement, and/or other configurations may be used to provide an input to the controller 106 to indicate that an over-voltage condition has occurred.

Figure 6:
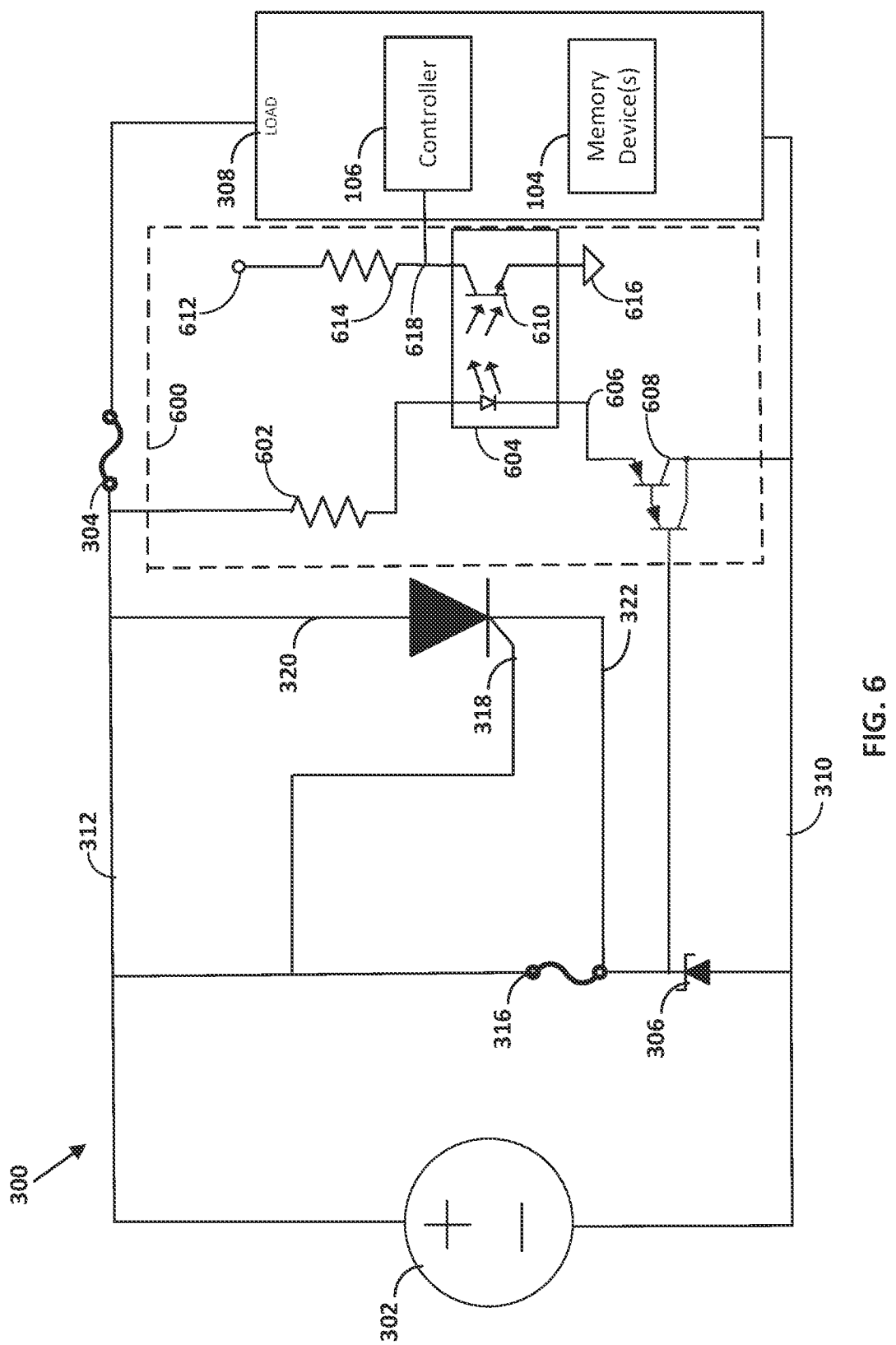
FIG. 6 is a block diagram of the power supply circuit of FIG. 3 having a voltage-based over-voltage detection circuit, according to some embodiments.

Turning now to FIG. 6, the power supply circuit 300 of FIG. 3 is shown and further includes a voltage-based over-voltage detection circuit 600. A first resistor 602 is positioned between the positive bus 312 and an input to an optocoupler 604. A common connection 606 of the optocoupler 604 is coupled to a switch 608. As shown in FIG. 6, the switch 608 is a Darlington pair; however, other switch types are also contemplated. An input to the switch 608 is coupled to the cathode of the voltage clamp/ESD device 306. In the embodiment shown in FIG. 6, the switch 608 is an PNP-based switch, and thus the switch 608 conducts when the input (e.g., gate voltage) is coupled to a common point of the circuit (e.g., a low potential, such as less than 1 VDC). Thus, when the voltage clamp/ESD device 306 breaks over due to an over voltage condition, the input to the switch 608 is approximately equal to the reverse bias voltage of the voltage clamp/ESD device 306. In one example, the reverse bias voltage of the voltage clamp/ESD device 306 is 0.7 VDC. However, reverse bias voltages of more than 0.7 VDC or less than 0.7 VDC are also contemplated. When the reverse bias voltage is applied to the input/gate of the switch 608, the switch 608 operates in a conduction state, and thus completes the current path for the input of the optocoupler 604, resulting in the optocoupler 604 activating an output.

Activating the output of the optocoupler 604 causes the output of the optocoupler 604 to turn on a switch 610 at the optocoupler 604 output. When the switch 610 is turned on, a current path from a logic high voltage source 612 through a pull up resistor 614 and to a common potential terminal 616 is created. The current through the pull-up resistor 614 causes a voltage of the logic high voltage source 612 to be substantially dropped across the pull-up resistor 614, resulting in a logic low level (e.g., less than 1V) at connection point 618. The connection point 618 may be coupled to an input of the controller 106. When the voltage at the connection point 618 transitions to a logic low, the controller 106 may interpret the change in logic level as indicating that an over-voltage condition has occurred. In one example, the logic high voltage source 612 is 3.3 VDC. However, voltages of more than 3.3 VDC or less than 3.3 VDC are also contemplated as required for a given application. Additionally, while FIG. 6 shows a pull-up arrangement being used on the output of the optocoupler 604, it is contemplated that other arrangements, such a pull-down arrangement, and/or other configurations may be used to provide an input to the controller 106 to indicate that an over-voltage condition has occurred.

Figure 7:
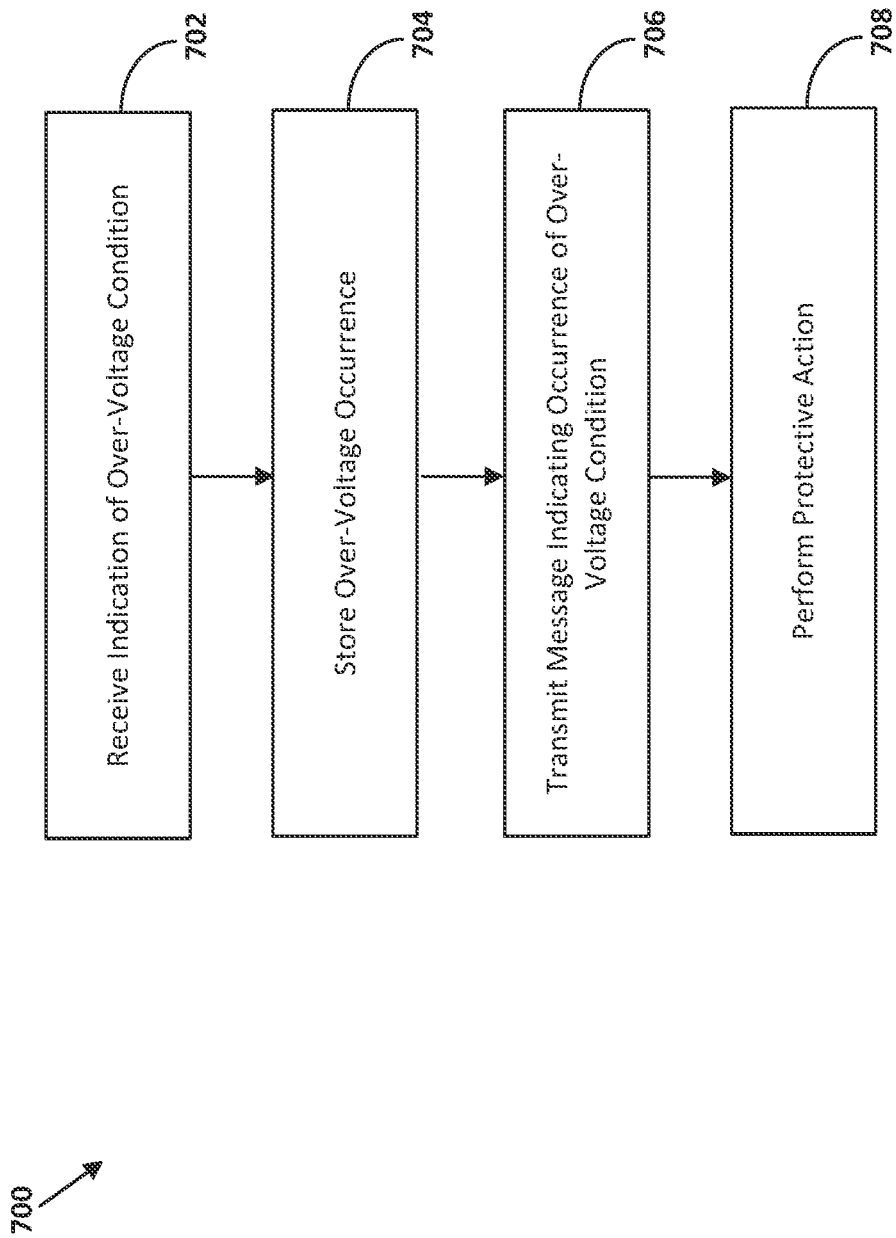
FIG. 7 is a flow chart illustrating a process for detecting an over-voltage condition within a data storage device, according to some embodiments.

Turning now to FIG. 7, a flow chart illustrating a process 700 for detecting an over-voltage condition is shown, according to some embodiments. In one embodiment, the process 700 is performed by the controller 106. In one embodiment, the power monitoring application 130 may perform the process 700. However, while the process 700 is described as being performed by the controller 106, it is contemplated that in some examples, other components, such as dedicated circuitry, the memory devices 104, and/or the host device 108 may be configured to perform the process 700. At process block 702, the controller 106 receives an indication that an over-voltage event has occurred. For example, the controller 106 may receive an input from one of the current-based over-voltage detection circuit 500 or the voltage-based over-voltage detection circuit 600, as described above. However, in some examples, other detection circuitry may be used to provide an input to the controller 106 indicating an over-voltage condition has occurred.

At process block 704, the controller 106 stores the indication of an over-voltage event as a fault other designated event type. In one embodiment, the controller 106 stores the indication in the memory 126. In still further embodiments, the controller 106 may store the indication, as well as other information, such as time, duration (if applicable), etc. The indication may be stored as an over-voltage event and/or fault for later access by one or more external devices, such as the host device 108.

At process block 706, the controller 106 may transmit a message indicating that an over-voltage event was detected. For example, the controller 106 may transmit the message using the host interface 120. However, in other examples, the controller 106 may utilize various other communication methods, such as wireless communication (e.g., Wi-Fi, Bluetooth, Cellular), wired communications, etc. For example, the controller 106 may communicate to other external device other than the host device 108, such as smartphones, tablet computers, diagnostic device, or other applicable external devices. The host device 108 and/or other external devices may provide various indications (e.g., visual or audio alerts) to a user or monitoring system that an over-voltage event has been detected. In some examples, the controller 106 may store or log the detected over-voltage event in the memory 126 for later access and/or analysis.

At process block 708, the controller 106 may optionally perform one or more protective actions, such as removing power to the data storage device 102, disconnecting power connections to one or more power supplies associated with the detected over-voltage event, etc. In some examples, the power management circuit 144 may perform the protection actions, such as disconnecting the data storage device 102 from the power source. In the event that power is removed to the data storage device 102, the power management circuit 144 may use internally stored energy, such as energy stored in one or more capacitors, to perform a safe shut down of the data storage device 102 to prevent data corruption or other damage to the components of the data storage device 102.

While the above systems, devices, processes, etc., have been described with respect to a data storage device, it is contemplated that other electronic devices, such as cellular phones, tablet computers, laptops, etc., may utilize one or more of the concepts described herein for monitoring one or more power supplies for an over-voltage condition.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
   a power supply circuit configured to supply power to the data storage device, the power supply circuit including:
      a voltage clamp configured to operate in a conduction state in response to an over-voltage condition of the power supply circuit;
      a fuse in series with the voltage clamp and the positive voltage bus, wherein the fuse is configured to open in response to a current flowing through the fuse and the voltage clamp exceeding a threshold value; and
      a switching device configured to latch in a forward conduction mode in response to the voltage clamp operating in the conduction state, wherein the switching device couples a positive voltage bus to the voltage clamp when operating in the forward conduction mode.

2. The data storage device of claim 1, wherein the switching device is a thyristor.

3. The data storage device of claim 1, wherein the voltage clamp is a Zener diode.

4. The data storage device of claim 1, further comprising an over-voltage detection circuit configured to generate an indication that an over-voltage condition has occurred.

5. The data storage device of claim 4, wherein the over-voltage detection circuit is a current-based over-voltage detection circuit configured to determine that the over-voltage condition has occurred based on detecting a switching device current flowing through the switching device.

6. The data storage device of claim 4, wherein the over-voltage detection circuit is a voltage-based over-voltage detection circuit configured to determine that the over-voltage condition has occurred based on a change in a voltage at an output of the switching device.

7. The data storage device of claim 4, further comprising a controller configured to:
   receive the indication from the over-voltage detection circuit that the over-voltage condition has occurred; and
   store a fault indicating that the over-voltage condition has occurred in a memory.

8. The data storage device of claim 7, wherein the controller is further configured to transmit the fault to an external device.

9. A method performed by a data storage device having a controller coupled to a non-volatile memory device, the method comprising:
   detecting an occurrence of an over-voltage condition, wherein the over-voltage condition is detected by an over-voltage detection circuit;
   operating a voltage clamp of the data storage device in a conduction state in response to the occurrence of the over-voltage condition;
   latching a switching device of the data storage device in a forward conduction mode in response to the voltage clamp operating in the conduction state, wherein the switching device couples a positive voltage bus of a power supply circuit of the data storage device to the voltage clamp when operating in the forward conduction mode;
   receiving an indication of the detected occurrence of the over-voltage condition at the controller;
   storing the occurrence of the over-voltage condition in a memory; and
   transmitting the occurrence of the over-voltage condition to an external device.

10. The method of claim 9, further comprising disconnecting the data storage device from a power source in response to receiving the indication of the detected occurrence of the over-voltage condition.

11. The method of claim 9, wherein the over-voltage detection circuit is a current-based over-voltage detection circuit.

12. The method of claim 9, wherein the over-voltage detection circuit is a voltage-based over-voltage detection circuit.

13. The method of claim 9, wherein the over-voltage detection circuit includes an opto-coupler.

14. A data storage device, comprising:
   a power supply circuit, including:
      a voltage clamp configured to operate in a conduction state in response to an over-voltage condition of the power supply circuit;
      a fuse in series with the voltage clamp and the positive voltage bus, wherein the fuse is configured to open in response to a current flowing through the fuse and the voltage clamp exceeding a threshold value;
      a switching device configured to latch in a forward conduction mode in response to the voltage clamp operating in the conduction state, wherein the switching device couples a positive voltage bus to the voltage clamp when operating in the forward conduction mode; and
      an over-voltage detection circuit configured to detect an occurrence of an over-voltage event.

15. The data storage device of claim 14, wherein the over-voltage detection circuit is a current-based over-voltage detection circuit configured to determine that an over-voltage condition has occurred based on the current flowing through the switching device.

16. The data storage device of claim 14, wherein the over-voltage detection circuit is a voltage-based over-voltage detection circuit configured to determine that an over-voltage condition has occurred based on a change in a voltage at an output of the switching device.

17. The data storage device of claim 14, further comprising a controller configured to:
   receive an indication from the over-voltage detection circuit that an over-voltage condition has occurred; and
   store the occurrence of the over-voltage condition in a memory.

18. The data storage device of claim 17, wherein the controller is further configured to transmit the occurrence of the over-voltage condition to an external device.

19. The data storage device of claim 14, wherein the switching device is a thyristor.

20. The data storage device of claim 14, wherein the voltage clamp is a Zener diode.

* * * * *